(12) United States Patent
Ahn et al.

(10) Patent No.: US 6,586,792 B2
(45) Date of Patent: Jul. 1, 2003

(54) STRUCTURES, METHODS, AND SYSTEMS FOR FERROELECTRIC MEMORY TRANSISTORS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/809,560

(22) Filed: Mar. 15, 2001

(65) Prior Publication Data

US 2002/0130338 A1 Sep. 19, 2002

(51) Int. Cl.⁷ .............................. H01L 29/76
(52) U.S. Cl. .................. 257/295; 365/145; 365/149; 257/295; 257/298; 257/300; 257/308; 257/310; 438/239; 438/250; 438/253; 438/393
(58) Field of Search ................. 365/145, 149; 257/295, 298, 300, 308, 310; 438/239, 250, 253, 393

(56) References Cited

U.S. PATENT DOCUMENTS

| | | | |
|---|---|---|---|
| 4,161,038 A | 7/1979 | Wu | 365/145 |
| 5,403,788 A | 4/1995 | Nishida et al. | 501/32 |
| 5,541,871 A | 7/1996 | Nishimura et al. | 365/145 |
| 5,579,258 A | 11/1996 | Adachi | 365/145 |
| 5,635,433 A | 6/1997 | Sengupta | 501/137 |
| 5,744,374 A | 4/1998 | Moon | 437/60 |
| 5,847,423 A | 12/1998 | Yamamichi | 257/296 |
| 5,856,688 A | 1/1999 | Lee et al. | 257/295 |
| 6,151,241 A | 11/2000 | Hayashi et al. | 365/145 |
| 6,198,119 B1 * | 3/2001 | Nabatame et al. | 257/295 |
| 6,242,298 B1 * | 6/2001 | Kawakubo | 438/239 |
| 6,373,743 B1 * | 4/2002 | Chen et al. | 365/145 |

OTHER PUBLICATIONS

Cho, I.H., et al., "Highly Reliable Dual Gate Oxide Fabrication by Reducing Wet Etching Time and Re–Oxidation for Sub–Quarter Micron CMOS Devices", *Extended Abstracts of the 1999 International Conference on Solid State Devices and Materials*, pp. 174–175, (1999).

Etzold, K.F., "Ferroelectric and Piezoelectric Materials", *The Electrical Engineering Handbook (computer file): CRCnetBASE*, pp. 1–13, (1999).

Guo, X., et al., "High Quality Ultra–thin $TiO_2/Si_3N_4$ Gate Dielectric for Giga Scale MOS Technology", *Technical Digest of 1998 IEDM*, pp. 377–380, (1998).

Han, B.M., et al., "Chopping effect on the crystallinity of ZnO films prepared by a r.f. planar magnetron sputtering method", *Thin Solid Films*, 338, pp. 265–268, (1999).

(List continued on next page.)

*Primary Examiner*—David Nelms
*Assistant Examiner*—Mai-Huong Tran
(74) *Attorney, Agent, or Firm*—Schwegman, Lundberg, Woessner & Kluth, P.A.

(57) ABSTRACT

Integrated memory circuits, key components in thousands of electronic and computer products, have recently been made using ferroelectric memory transistors, which offer faster write cycles and lower power requirements than over conventional floating-gate transistors. One problem that hinders the continued down-scaling of conventional ferroelectric memory transistors is the vulnerability of their gate insulations to failure at thinner dimensions. Accordingly, the inventors devised unique ferroelectric gate structures, one of which includes a high-integrity silicon-oxide insulative layer, a doped titanium-oxide layer, a weak-ferroelectric layer, and a control gate. The doped titanium-oxide layer replaces a metal layer in the conventional ferroelectric gate structure, and the weak-ferroelectric layer replaces a conventional ferroelectric layer. These replacements reduce the permittivity mismatch found in conventional gate structures, and thus reduce stress on gate insulation layers, thereby improving reliability of ferroelectric memory transistors, particularly those with thinner gate insulation.

15 Claims, 2 Drawing Sheets

OTHER PUBLICATIONS

Ishiwara, H., "Proposal of a Novel Ferroelectric–Gate Field Effect Transistor with Separated Functions for Data read–Out Data Storage", Precision and Intelligence Laboratory, Tokyo Institute of Technology, pp. 222–223.

Kobayashi, K., et al., "Mechanism of Photoinduced Charge Transfer in Co(Li) –Doped ZnO Film", *Japanese Journal of Applied Physics*, 31, pp. L 1079–L 1082, (1992).

Matsuo, K., et al., "Low Leakage $TiO_2$ Gate Insulator formed by Ultrathin TiN Deposition and Low–Temperature Oxidation", *Japanese Journal of Applied Physics*, vol. 39, No. 10, 5794–5799, (Oct. 2000).

Nishino, J., et al., "Preparation of Zinc Oxide Films by Low–Pressure Chemical Vapor Deposition Method", *Materials Research Society Symposium Proc*, 363, pp. 219–224, (1995).

Onodera, A., et al., "Dielectric Activity and Ferroelectricity in Piezoelectric Semiconductor Li–Doped ZnO", *Japanese Journal of Applied Physics*, 35, pp. 5160–5162, (1996).

Onodera, A., et al., "Ferroelectric Properties in Piezoelectric Semiconductor $Zn_{1-x}M_xO$ (M=Li, Mg)", *Japanese Journal of Applied Physics*, 36, pp. 6008–6011, (1997).

Saito, Y., et al., "High–Integrity Silicon Oxide Grown at Low–temperature by Atomic Oxygen Generated in High–Density Krypton Plasma", *Extended Abstracts of the 1999 International Conference on Solid State Devices and Materials*, pp. 152–153, (1999).

Suntola, T., "Atomic layer epitaxy", *Thin Solid Films*, 216, pp. 84–89, (1992).

Valentini, A., et al., "Preparation and characterization of Li–doped ZnO films", *American Vacuum Society*, pp. 286–289, (1991).

Vehkamäki, M., et al., "Growth of $SrTiO_3$ and $BaTiO_3$ Thin Films by Atomic Layer Deposition", *Elecrtochemical and Solid–State Letters*, vol. 2, No. 10, 504–506, (Oct. 1999).

* cited by examiner

STRUCTURES, METHODS, AND SYSTEMS FOR FERROELECTRIC MEMORY TRANSISTORS

RELATED APPLICATIONS

This application is related to co-assigned application Ser. No. 09/383,726 which was filed on Aug. 26, 1999 and to co-assigned application Ser. No. 09/594,817 which was filed on Jun. 16, 2000. These applications are incorporated herein by reference.

TECHNICAL FIELD

The present invention concerns integrated memory circuits, ferroelectric memory transistors, and methods of making these circuits and transistors.

BACKGROUND OF THE INVENTION

Integrated memory circuits serve as data-storage components in thousands of products, from televisions, to automobiles, to computers. Typically, these memory circuits are implemented as arrays of floating-gate transistors, with each transistor storing an electrical charge representative of a one or a zero on its floating gate.

In recent years, these floating-gate transistors have been modified to include a layer of ferroelectric material that exhibit electric polarizations, analogous to magnetic polarizations, in response to appropriate electrical signals. One electrical signal polarizes the material to represent a zero, and another signal oppositely polarizes the material to represent a one. The polarizations affect operation of the transistors in specific ways, which enables detection of their polarization states and thus recovery of stored data. Memory circuits using these ferroelectric memory transistors enjoy advantages, such as faster write cycles and lower power requirements, over conventional floating-gate memory circuits.

The present inventors have identified at least one problem with the conventional structure of these ferroelectric memory transistors. The conventional structure includes a semiconductive layer and a multi-layer gate structure stacked atop the semiconductive layer. Built upward from the semiconductive layer, the gate structure comprises a silicon-dioxide insulative layer, a metal layer, a ferroelectric layer, and a control gate.

The problem is that the multilayer gate structure forces the insulative layer to withstand a greater portion of voltages applied to the control gate than the ferroelectric layer, even though the ferroelectric, because of its at least 100 times greater permittivity, can withstand greater voltages than the insulative layer. More precisely, the metal layer and the large difference in permittivities (or dielectric constants) of the silicon dioxide and conventional ferroelectric material (4 versus 400 or more) cause the gate structure to behave as a series connection of a small capacitor and a large capacitance, with a greater portion of any applied voltage falling across the silicon dioxide of the small capacitor than the ferroelectric layer of the large capacitor. The inventors expect this small-capacitor-large-capacitor behavior to compromise reliability as fabricators attempt to meet the demand for smaller ferroelectric memories using thinner insulative layers, which are more likely to breakdown under their disproportionate share of applied voltages.

Accordingly, there is a need for ferroelectric memories that can scale to smaller dimensions with better reliability.

SUMMARY OF THE INVENTION

To address these and other needs, the inventors devised unique ferroelectric gate structures and related fabrications methods. One exemplary gate structure includes a high-integrity silicon oxide insulative layer; a doped titanium-oxide layer; a weak ferroelectric layer; and a control gate. In contrast to the conventional gate structure, this exemplary structure replaces the metal layer between the insulative layer and the ferroelectric layer with a titanium-oxide layer and the conventional ferroelectric layer with a weak ferroelectric, reducing the permittivity mismatch across the layers and thus promoting a more balanced voltage distribution across them. This, in turn, promotes reliability of gate structures with thinner gate insulation.

An exemplary fabrication method entails forming the silicon-oxide layer in a low-temperature oxygenation process using a Krypton plasma, forming the doped titanium-oxide layer using atomic-layer deposition, and forming the weak ferroelectric from a doped zinc oxide. Exemplary dopants for the titanium-oxide layer include strontium or barium, and exemplary dopants for the zinc oxide include lithium and magnesium.

DESCRIPTION OF THE PREFERRED EMBODIMENTS

The following detailed description, which references and incorporates FIGS. 1–4, describes and illustrates specific embodiments of the invention. These embodiments, offered not to limit but only to exemplify and teach the invention, are shown and described in sufficient detail to enable those skilled in the art to implement or practice the invention. Thus, where appropriate to avoid obscuring the invention, the description may omit certain information known to those of skill in the art.

Figure 1:
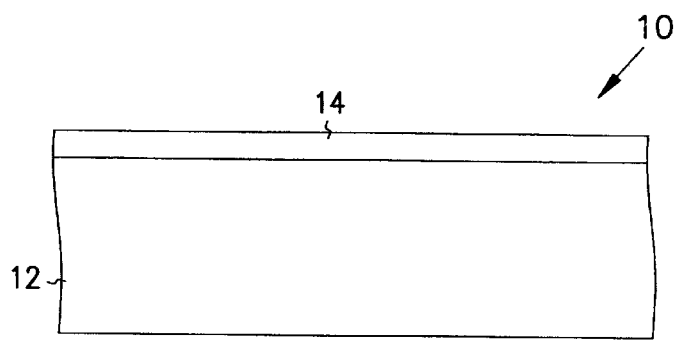
FIG. 1 is a cross-sectional view of an integrated-circuit assembly including an exemplary high-integrity insulative layer 14.
Figure 2:
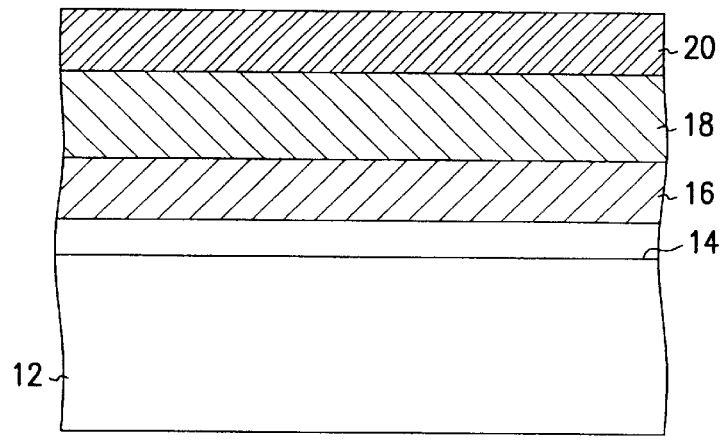
FIG. 2 is a cross-sectional view of the FIG. 1 integrated-circuit assembly after formation of a doped titanium layer 16, a weak ferroelectric layer 18, and a conductive control gate layer 20.
Figure 3:
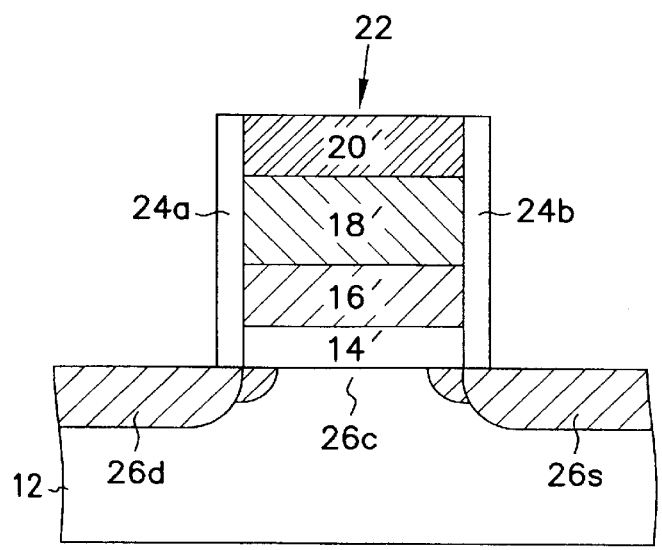
FIG. 3 is a cross-sectional view of the FIG. 2 assembly after forming a gate stack 22, sidewall spacers 24a and 24b, and drain, source, and channel regions 26d, 26c, and 26s.
Figure 4:
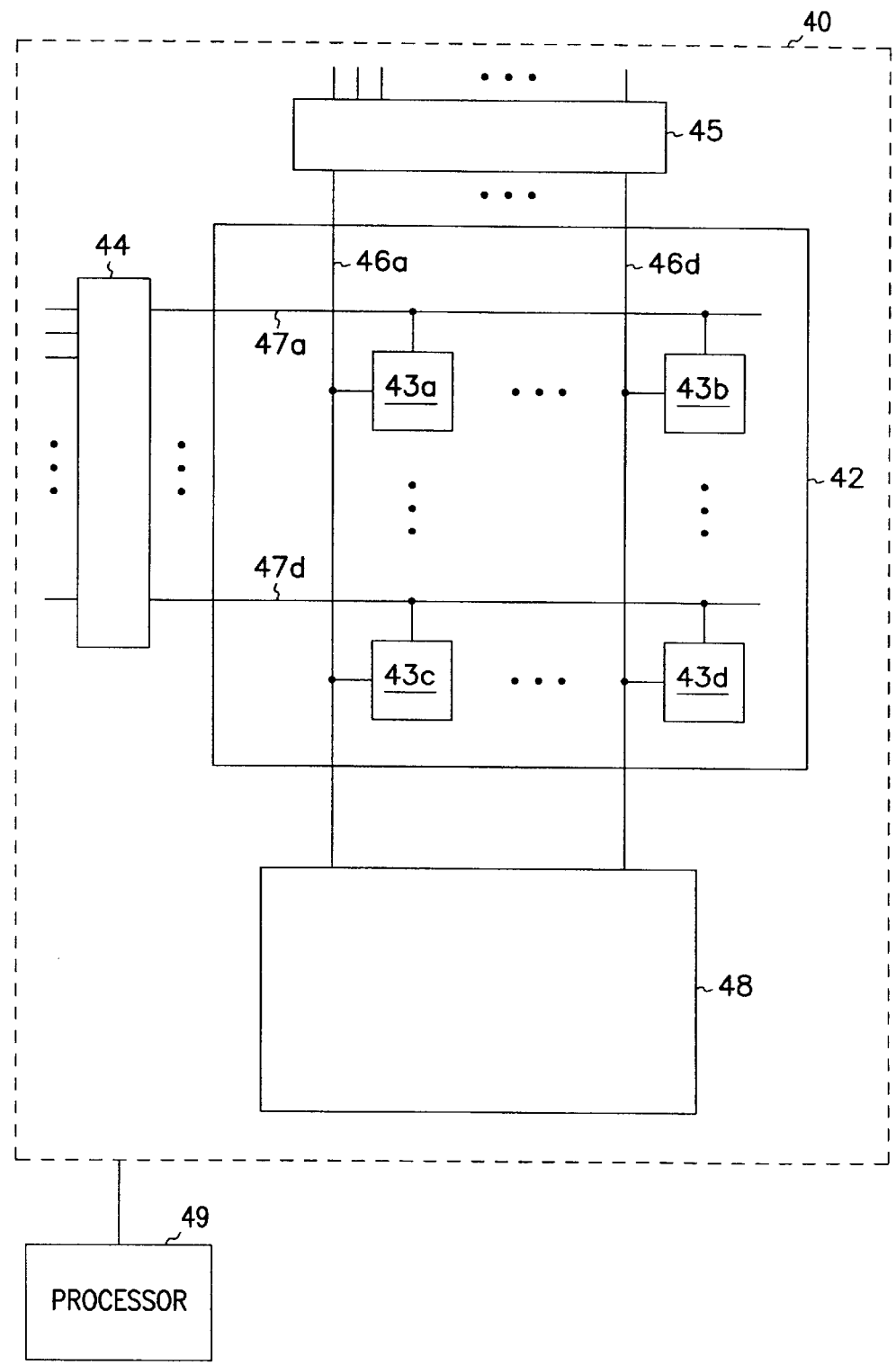
FIG. 4 is a block diagram of an exemplary ferroelectric-memory circuit 40 that incorporates ferroelectric memories having gate structures according to the present invention.

FIGS. 1–3 show a number of exemplary integrated-circuit assemblies, which taken collectively and sequentially, illustrate an exemplary method of fabricating a ferroelectric memory transistor according to the present invention. FIG. 4 shows an exemplary random-access-memory circuit incorporating ferroelectric memory transistors of the present invention. (As used herein, the term "ferroelectric," connotes any material or material structure, such as a layer, that exhibits a detectable spontaneous electrical polorization in response to appropriate electrical stimulus. Thus, the term encompasses elemental ferroelectric materials as well as combinations of elemental ferroelectric materials in combination with other materials.)

Exemplary Fabrication Methods and Structures for Ferroelectric Memories

The exemplary method, as shown in FIG. 1, begins with formation of a 2.5-nanometer-thick gate insulation layer 14 on a semiconductive surface of a substrate 12. (The term "substrate," as used herein, encompasses a semiconductor wafer as well as structures having one or more insulative, semi-insulative, conductive, or semiconductive layers and materials. Thus, for example, the term embraces silicon-on-insulator, silicon-on-sapphire, and other advanced structures.) In the exemplary embodiment, the semiconductive surface comprises silicon, and gate insulation layer 14 comprises silicon dioxide. However, other embodiments use silcon nitrides, silicon oxynitrides, or carbides.

More particularly, the exemplary method forms the gate insulation at a low temperature through direct oxidation of the semiconductive surface. One method of direct oxidation entails generation of atomic oxygen in a high-density krypton plasma, more precisely microwave excitation of a 97% krypton and 3% oxygen gas mixture at a temperature of about 400° C. This results in a high-integrity layer of silicon dioxide with a dielectric constant of about 4. In contrast, conventional thermal oxidation processes rely on ambient temperatures on the order of 1000° C. For further details, see Yuji Saito et al., "High Integrity Silicon Oxide Grown at Low Temperatures by Atomic Oxygen Generated in High-Density Krypton Plasma," Extended Abstracts of 1999 International Conference on Solid State Devices and Materials, pp. 152–153, which is incorporated herein by reference.

FIG. 2 shows that the exemplary method next entails formation of a 45-nanometer-thick dielectric layer 16, a 630-nanometer-thick weak-ferroelectric layer 18, and a control gate layer 20. Dielectric layer 16 has a dielectric constant greater than that of dielectric layer 14 and less than that of weak-ferroelectric layer 18.

Specifically, the exemplary method uses atomic-layer deposition (atomic layer epitaxy) to form dielectric layer 16 of a titanium oxide doped with strontium (TiSrO$_3$) or doped with barium (TiBaO$_3$). Titanium-strontium oxide has a dielectric constant of about 165, and titanium-barium oxide has a dielectric constant of about 180.

An exemplary atomic-layer-deposition procedure uses a known reactor, such as that described in T. Suntola, Thin Solid Films, pp. 84–87 (1992), at a pressure of about 10 mbar. The exemplary procedure entails alternately introducing and evaporating a titanium precursor and a dopant precursor into the reactor through respective channels for metallic and non-metallic reactancts. (Inert gas valving is used to control flow of reactants through the channels.) Water vapor, held in an external room-temperature reservoir, is also introduced into the reactor with each precursor.

An exemplary precursor for titanium is Ti(O—I—Pr)$_4$, which is evaporated at 40° C.; an exemplary precursor for strontium is Sr(C$_5$—I—Pr$_3$H$_2$)$_2$, which is evaporated at 100° C.; and an exemplary precursor for barium is Ba(C$_5$Me$_5$)$_2$ which is evaporated at 160° C. Sr(C$_5$—I—Pr$_3$H$_2$)$_2$ and Ba(C$_5$Me$_5$)$_2$ are also known respectively as "strontium bis(triisopropylcyclopentadienyl)" and "barium bis(pentamethylcyclopentadienyl), both of which are cyclopentadienyl compounds. An exemplary pulse time for introduction of the precursors is 0.6 seconds and an exemplary purge time is 0.5 seconds. High purity (99.9995%) nitrogen is used as a carrier and a purging gas. Varying the ratio of Ti—O and Sr—0 or Br—O deposition cycles controls composition of the resulting dielectric layer.

After formation of dielectric layer 16, the exemplary method forms weak-ferroelectric layer 18 of a lithium- or magnesium-doped zinc oxide, which has a dielectric constant of 250. Zinc oxide is an n-type piezoelectric II-VI semiconductor with wurtzite structure. Although stoichiometric zinc oxide is an insulator, doping of zinc oxide with lithium and/or magnesium engenders ferroelectric properties in the zinc oxide.

In some embodiments, the doped zinc oxide material is doped with lithium at a level from approximately 1 mol percent up to approximately 30 mol percent of the metal component. The resultant the doped material is characterized by a generic formula of $Zn_xLi_{1-x}O$, where x ranges from approximately 0.70 to approximately 0.99. Other embodiments dope the zinc oxide with magnesium at a level from approximately 1 mol percent to approximately 30 mol percent of the metal component, with the resultant composition having the generic formula $Zn_xMg_{1-x}O$, where x ranges from approximately 0.70 to approximately 0.99. Still other embodiments dope the zinc oxide with lithium and magnesium at a level from approximately 1 mol percent up to approximately 30 mol percent of the metal component, yielding the generic composition $Zn_x(Li_yMg_z)O$ where x ranges from approximately 0.70 to approximately 0.99, y and z each independently range from approximately 0.00 to approximately 0.30 and the sum of y+z ranges from approximately 0.01 to approximately 0.30. There is no requirement that the oxide materials contain stoichiometric levels of oxygen, that is, one oxygen atom for each metal atom. In fact, it is expected that there will be excess metal atoms in the oxide structure. The proportions described herein relate solely to the metal component portion of the oxide materials.

One procedure for forming the doped zinc oxide entails magnetron sputtering using a zinc-oxide target embedded with strips or particles of lithium, magnesium, or both, and an inert gas, such as argon, krypton, or xenon, with and without oxygen. A second procedure entails jet-vapor deposition of zinc oxide and lithium carbonate (Li$_2$CO$_3$) or magnesium oxide (MgO) in a vacuum. And a third procedure is low-pressure chemical-vapor deposition. Examples of sputtered zinc-oxide and doped-zinc-oxide films are disclosed in a. Onodera, et al, "Dielectric Activity and Ferroelectricity in Piezoelectric Semiconductor Li-Doped ZnO," Japan Journal of Applied Physics., Vol. 35, pp 5160–5162 (1996) and in a. Onodera, et al. "Ferroelectric Properties in Piezoelectric Semiconductor Zn$_{1-x}$M$_x$O (M=Li, Mg)," Japan Journal of Applied Physics, Vol. 36, p. 6008–6011 (1997,) which are both incorporated herein by reference.

Although the exemplary embodiment uses a doped zinc oxide to form its weak ferroelectric, other embodiments may use other materials. Indeed, the inventors regard a weak ferroelectric as any material composition that exhibits a spontaneous polarization in the range of approximately 0.01 micro-Coulomb/cm$^2$ to 1 micro-Coulomb/cm$^2$. The weak ferroelectric of the exemplary embodiment has dielectric constant less than 400, such as 250. In contrast, conventional ferroelectrics, such as barium titanate (BaTiO$_3$), exhibit polarizations on the order of 10 micro-Coulomb/cm$^2$ and dielectric constants in the range of 400 to 2500.

The exemplary embodiment sets the thickness of the weak ferroelectric layer at 630 nanometers, which is measured in a dimension parallel to the applied electric fields. However, other thicknesses are feasible. Some embodiments restrict the ferroelectric thickness to be greater than the thickness of insulator layer 310, while others use a ferroelectric layer thickness that facilitates programming of the ferroelectric layer, that is, change of its polarization state, at an applied voltage less than the breakdown voltage of gate insulation layer 14. In still other embodiments, the ferroelectric thickness facilitates programming at a voltage between the breakdown voltage of the gate insulator layer 14 and a power supply voltage. Some embodiments use a ferroelectric thicknesses less than approximately 10,000 angstroms together with gate-insulator thicknesses less than approximately 1,000 angstroms, to facilitate programming at a gate voltage of approximately 1 volt. And yet other embodiments provide a ferroelectric thickness less than approximately 10 times the thickness of the gate insulator.

After formation of the ferroelectric layer, gate contact layer 20 is formed using conventional techniques. In the exemplary embodiment, the gate contact layer comprises a doped polysilicon.

FIG. 3 shows the results of forming layers 14, 16, 18, and 20 into a gate stack 22, adding sidewalls 24a and 24b to gate stack 22, and defining respective drain, channel, and source regions 26d, 26c, and 26s. This involves conventionally patterning layer 20 and then etching through layers 16 and 18 down to gate insulation layer 14. The resulting gate stack 22 includes layers 14', 16', 18', and 20', which correspond in composition and thickness to respective layers 14, 16, 18, and 20.

Subsequent to formation of the gate stack, the exemplary method forms respective self-aligned drain and source regions 26d and 26s in substrate 12, using conventional ion-implantation techniques. Although the exemplary embodiment uses a lightly doped drain (LDD) profile, any desirable profile may be chosen. Other embodiments use, for example, an abrupt junction or a "fully overlapped, lightly doped drain" (FOLD) profile. To achieve the exemplary profile, the method forms insulative sidewall spacers 24a and 24b on opposing sidewalls of gate stack 22, before executing the ion-implantation procedure which forms drain and source regions 26d and 26s. Exemplary implantation doses are $10^{15}$ per square centimeter. Formation of drain and source regions 26d and 26s also defines the length of semiconductive channel region 26c.

With completion of the gate stack and self-aligned drain and source regions, conventional techniques are used to form drain and source contacts (not shown). Additionally, conventional interconnection techniques can be used to connect the gate contact and the drain and source contacts to each other, to one or more contacts of other similar or different transistors, and/or to other components to make a complete integrated circuit.

In operation, gate insulation layer 14 and weak-ferroelectric layer 18 function as the dielectrics of two series-connected capacitors, with the doped titanium oxide layer shared by the capacitors. The combined or system capacitance $C_s$ across the two series capacitors is $C_s=(C_1 \times C_2)/(C_1+C_2)$, where $C_1$ denotes the capacitance associated with gate insulator layer 14 and $C_2$ denotes the capacitance associated with weak-ferroelectric layer 18. Capacitance of each layer is governed by the equation $C_x=(\epsilon_x \times area_x)/thickness_x$ where x is 1 for gate insulator layer 14 or 2 for weak-ferroelectric layer 18, and $\epsilon_x$ is the permittivity.

Furthermore, as a series capacitance, the voltage drop appearing across each dielectric layer is inversely proportional to its respective capacitance. Thus, the voltage drop $V_1$ across gate insulation layer 14 is computed by $V_1=(V_A \times C_2)/(C_1+C_2)$, where $V_A$ denotes the total voltage across gate insulator layer 14 and ferroelectric layer 18. $V_2$, the voltage drop across weak-ferroelectric layer 18, is similarly computed using $V_2=(V_A \times C_1)/(C_1+C_2)$. Accordingly, for any given applied voltage, one can calculate appropriate thicknesses for the weak-ferroelectric layer and the gate insulation layer to allow programming of the weak-ferroelectric layer without exceeding the breakdown voltage of gate insulation.

The polarization state of the weak-ferroelectric layer can be determined by applying a gate voltage having a magnitude less than the programming voltage and sensing the conductivity of the transistor from the source region to the drain region. Distinctly different conductivity states will exist depending on the polarization state of the ferroelectric layer due to the change in the threshold voltage of the field effect transistor.

The transistor thus can function as an electrically-alterable programmable read-only memory (EAPROM) device. EAPROM devices can replace not only flash memory and electrically-erasable programmable read-only memory (EEPROM) devices, but also dynamic random-access memory (DRAM) and static random-access memory (SRAM). They can be also used in programmable logic arrays (PLAs) and memory address and correction decode circuits.

Exemplary Ferroelectric Memory Circuit
Incorporating the Exemplary Ferroelectric Memory FIG. 4 shows an exemplary ferroelectric memory circuit 40. Circuit 40, which operates according to well-known and understood principles, is generally coupled to a processor (shown as block 49) to form a computer system. More precisely, circuit 40 includes a memory array 42 which comprises a number of memory cells 43a–43d, a column address decoder 44, and a row address decoder 45, bit lines 46a–46d, word lines 47a–47d, and a voltage-sense-amplifier circuit 48 coupled in conventional fashion to bit lines 46.

In the exemplary embodiment, each of the memory cells, the address decoders, and the amplifier circuit includes one or more ferroelectric memories that has a stacked gate structure in accord with the present invention. However, in other embodiments, only one of the components, for example, memory array 42 or voltage-sense-amplifier circuit 48, includes ferroelectric memories having a gate structure in accord with the invention.

CONCLUSION

In furtherance of the art, the inventors have presented unique ferroelectric gate structures for ferroelectric memories and related fabrications methods. One exemplary gate structure includes a high-integrity silicon oxide insulative layer; a doped titanium-oxide layer; a weak ferroelectric layer; and a control gate. This exemplary arrangement reduces the permittivity mismatch and promotes a more balanced voltage distribution across the layers of the gate structure and thus greater reliability.

The embodiments described above are intended only to illustrate and teach one or more ways of practicing or implementing the present invention, not to restrict its breadth or scope. The actual scope of the invention, which embraces all ways of practicing or implementing the invention, is defined only by the following claims and their equivalents.

What is claimed is:
1. A ferroelectric memory transistor comprising:
    a silicon substrate having a drain region and a source region; and
    a stacked gate structure including:
        a first insulative layer on the silicon substrate between the drain and source regions;
        a ferroelectric layer; and
        a doped insulative layer between the first insulative layer and the ferroelectric layer,
        wherein the ferroelectric layer is a weak ferroelectric layer.

2. The transistor of claim 1, wherein the ferroelectric layer is characterized by a spontaneous polarization within a range of approximately 0.01 micro-Coulomb/cm$^2$ to 1 micro-Coulomb/cm$^2$.

3. A ferroelectric memory transistor comprising:
a silicon substrate having a drain region and a source region; and
a stacked gate structure including:
a first insulative layer on the silicon substrate between the drain and source regions;
a ferroelectric layer; and
a doped insulative layer between the first insulative layer and the ferroelectric layer,
wherein the ferroelectric layer has a dielectric constant less than 1000.

4. A ferroelectric memory transistor comprising:
a silicon substrate having a drain region and a source region; and
a stacked gate structure including:
a first insulative layer on the silicon substrate between the drain and source regions;
a ferroelectric layer; and
a doped insulative layer between the first insulative layer and the ferroelectric layer,
wherein the doped insulative layer has a dielectric constant between that of the first insulative layer and that of the ferroelectric layer.

5. A ferroelectric memory transistor comprising:
a silicon substrate having a drain region and a source region; and
a stacked gate structure including:
a first insulative layer on the silicon substrate between the drain and source regions;
a ferroelectric layer; and
a doped insulative layer between the first insulative layer and the ferroelectric layer,
wherein the first insulative layer has a dielectric constant of about 4, the doped insulative layer has a dielectric constant of about 165 or 180, and the ferroelectric layer has a dielectric constant of about 250.

6. A ferroelectric memory transistor comprising:
a silicon substrate having a drain region and a source region; and
a stacked gate structure including:
a first insulative layer on the silicon substrate between the drain and source regions;
a ferroelectric layer; and
a doped insulative layer between the first insulative layer and the ferroelectric layer,
wherein the first insulative layer consists essentially of a silicon oxide.

7. A ferroelectric memory transistor comprising:
a silicon substrate having a drain region and a source region; and
a stacked gate structure including:
a first insulative layer on the silicon substrate between the drain and source regions;
a ferroelectric layer; and
a doped insulative layer between the first insulative layer and the ferroelectric layer,
wherein the doped insulative layer comprises at least one of strontium- or barium-doped titanium oxide.

8. A ferroelectric memory transistor comprising:
a silicon substrate having a drain region and a source region; and
a stacked gate structure including:
a first insulative layer on the silicon substrate between the drain and source regions;
a ferroelectric layer; and
a doped insulative layer between the first insulative layer and the ferroelectric layer, wherein the ferroelectric layer consists essentially of zinc oxide doped with lithium at a level of about 1 mol percent to about 30 mol percent of the metal component.

9. A ferroelectric memory transistor comprising:
a silicon substrate having a drain region and a source region; and
a stacked gate structure including:
a first insulative layer on the silicon substrate between the drain and source regions;
a ferroelectric layer; and
a doped insulative layer between the first insulative layer and the ferroelectric layer,
wherein the ferroelectric layer consists essentially of zinc oxide doped with magnesium at a level of about 1 mol percent to about 30 mol percent of the metal component.

10. A ferroelectric memory transistor comprising:
a silicon substrate having a drain region and a source region; and
a stacked gate structure including:
a first insulative layer on the silicon substrate between the drain and source regions;
a ferroelectric layer characterized by a spontaneous polarization in a range of approximately 0.01 micro-Coulomb/cm$^2$ to 1 micro-Coulomb/cm$^2$; and
a doped insulative layer between the first insulative layer and the ferroelectric layer.

11. A ferroelectric memory transistor comprising:
a silicon substrate having a drain region and a source region; and
a stacked gate structure including:
a first insulative layer on the silicon substrate between the drain and source regions;
a ferroelectric layer characterized by a spontaneous polarization in a range of approximately 0.01 micro-Coulomb/cm$^2$ to 1 micro-Coulomb/cm$^2$; and
a doped insulative layer between the first insulative layer and the ferroelectric layer, the doped insulative layer having a dielectric constant between that of the first insulative layer and that of the ferroelectric layer.

12. A ferroelectric memory transistor comprising:
a silicon substrate having a desired channel conduction region;
a silicon-oxide layer over the desired channel conduction region;
a strontium-doped titanium-oxide layer on the silicon-oxide layer;
a doped zinc-oxide layer on the doped titanium-oxide layer; and
a gate conductor on the zinc-oxide layer.

13. A ferroelectric memory transistor comprising:
a silicon substrate having a desired channel conduction region;
a silicon-oxide layer over the desired channel conduction region;

a strontium-doped titanium-oxide layer on the silicon-oxide layer;

a lithium-doped zinc-oxide layer on the doped titanium-oxide layer; and a gate conductor on the lithium-doped zinc-oxide layer.

14. A ferroelectric memory transistor comprising:

a silicon substrate having a desired channel conduction region;

a silicon-oxide layer over the desired channel conduction region;

a strontium-doped titanium-oxide layer on the silicon-oxide layer;

a magnesium-doped zinc-oxide layer on the doped titanium-oxide layer; and a gate conductor on the magnesium-doped zinc-oxide layer.

15. A ferroelectric memory transistor comprising:

a silicon substrate having a desired channel conduction region;

a silicon-oxide layer over the desired channel conduction region;

a barium-doped titanium-oxide layer on the silicon-oxide layer;

a doped zinc-oxide layer on the barium-doped titanium-oxide layer; and a gate conductor on the zinc-oxide layer.

* * * * *